(12) United States Patent
Chen

(10) Patent No.: US 7,298,630 B2
(45) Date of Patent: Nov. 20, 2007

(54) COUPLING MECHANISM

(75) Inventor: Ruei-Lin Chen, Taipei (TW)

(73) Assignee: Inventec Corporation, Taipei (TW)

( * ) Notice: Subject to any disclaimer, the term of this patent is extended or adjusted under 35 U.S.C. 154(b) by 438 days.

(21) Appl. No.: 11/125,072

(22) Filed: May 10, 2005

(65) Prior Publication Data

US 2006/0256542 A1 Nov. 16, 2006

(51) Int. Cl.
*H05K 9/00* (2006.01)

(52) U.S. Cl. ............... 361/818; 361/810; 361/800; 361/801; 361/802; 361/803; 361/809

(58) Field of Classification Search ........... 361/818, 361/810, 800, 801, 802, 803, 809
See application file for complete search history.

(56) References Cited

U.S. PATENT DOCUMENTS

| | | | | |
|---|---|---|---|---|
| 5,696,669 | A | * | 12/1997 | Bassler et al. ............... 361/816 |
| D415,116 | S | * | 10/1999 | Creutz et al. ............... D13/182 |
| 6,008,994 | A | * | 12/1999 | Bates .......................... 361/737 |
| 6,195,266 | B1 | * | 2/2001 | Padgett et al. ............... 361/799 |
| 6,428,330 | B1 | * | 8/2002 | Poulter et al. .............. 439/76.1 |
| 6,661,676 | B1 | * | 12/2003 | Chen ........................... 361/816 |
| 6,850,409 | B1 | * | 2/2005 | Triebes et al. ............... 361/684 |
| 2002/0093807 | A1 | * | 7/2002 | Saito et al. .................. 361/818 |

* cited by examiner

*Primary Examiner*—Tuan T. Dinh
*Assistant Examiner*—Hoa C Nguyen
(74) *Attorney, Agent, or Firm*—Rabin & Berdo, P.C.

(57) ABSTRACT

A coupling mechanism mainly includes a coupling member and two bucking blades. The coupling member has two anchor ends on two sides to anchor a plugging main board on the coupling member, and a groove on an upper side and a lower side, to hold the bucking blades. The bucking blades are squeezed and deformed when the coupling member is moved and latched on a coupling interface of an electronic device to fill the tolerance between the two, thus can prevent electromagnetic waves from leaking out. The two anchor ends are made of metal and can also prevent the electromagnetic waves from leaking out from two sides. The coupling mechanism solves the interference problem during assembly occurring to conventional coupling mechanisms that use annular conductive-foamed plastics. The cost of the coupling mechanism also decreases.

13 Claims, 6 Drawing Sheets

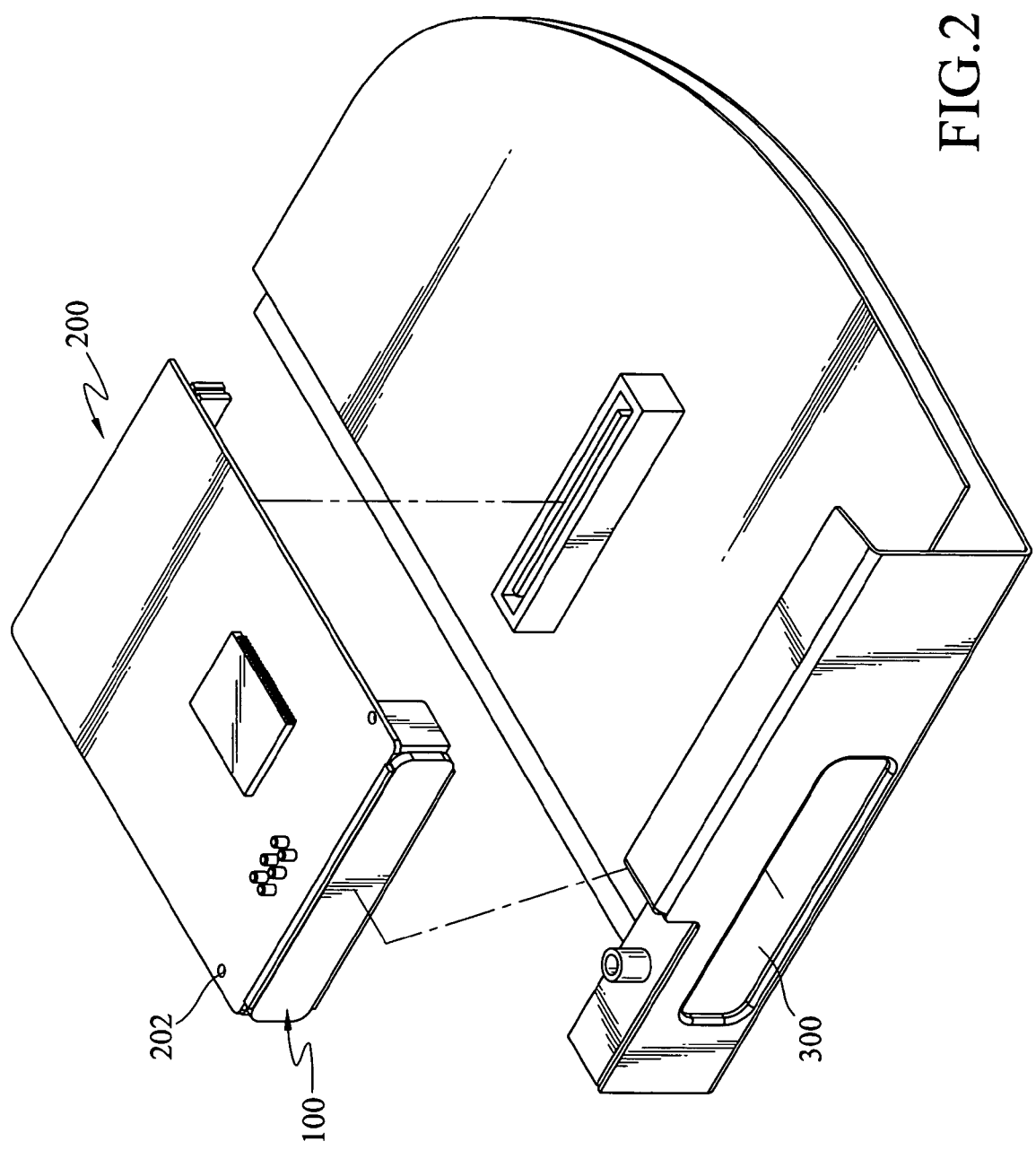

COUPLING MECHANISM

FIELD OF THE INVENTION

The present invention relates to a coupling mechanism and particularly to a coupling mechanism to reduce leaking of electromagnetic waves.

BACKGROUND OF THE INVENTION

The design of conventional electronic devices often involves reducing unstable electric current leakage and generation and leaking of electromagnetic waves, to comply with the requirements of international safety certifications, and prevent users from being hurt by the leaking current and electromagnetic waves.

The general approach to meet this objective is to channel the leaking current to the ground or use a shielding means to prevent the leaking current and electromagnetic wave from infiltrating through the tolerance of a coupling mechanism (assembly interface) which bridges a coupling interface and a plugging mainboard (such as the mainboard of a blade server, a graphic card, or the like).

Refer to FIGS. 1A, 1B and 1C for the conventional coupling mechanisms to prevent electromagnetic waves from leaking. FIG. 1A shows a first coupling mechanism. FIG. 1B shows a second coupling mechanism. FIG. 1C illustrates assembly of the second coupling mechanism.

Referring to FIG. 1A, the first coupling mechanism uses metal to provide a shielding effect, to prevent leaking of electromagnetic waves. On the outside (which is coupled with a coupling interface of an electronic device) of the coupling mechanism 10, an annular spacer 12 made of metal is provided to be wedged between a gap, formed between the coupling interface (not shown in the drawing) of the electronic device and the coupling mechanism 10, to reduce leaking of electromagnetic waves.

As there is a tolerance in the product design, a gap is formed between the annular spacer 12 and the coupling interface. Hence leaking of electromagnetic waves cannot be totally prevented.

To remedy the aforesaid problem, the second coupling mechanism is developed, including a conductive foamed plastic, capable of shielding electromagnetic waves, to prevent leaking of electromagnetic waves as shown in FIG. 1B. The coupling mechanism 20 has an annular conductive foamed plastic 24 located between an annular spacer 22 and a latch side of the coupling interface, to fill the tolerance mentioned above.

Referring to FIG. 1C, for assembly, the coupling mechanism 20 is moved and latched on a coupling interface 30 of an electronic device (not shown in the drawing), and the conductive foamed plastic 24 is squeezed by the coupling interface 30 and the annular spacer 22 and deformed, so that a tight coupling is formed between the coupling mechanism 20 and the coupling interface 30, and the gap of tolerance is filled to shield the electromagnetic waves.

However, the second coupling mechanism mentioned above still has drawbacks. Because the coupling mechanism 20 that attaches to the annular conductive foamed plastics 24 should be formed in a size slightly larger than the coupling interface 30 to enable the annular conductive foamed plastic 24 to be squeezed, to achieve a compensation effect, when the coupling mechanism 20 is moved and latched on the coupling interface 30 (for assembly), the periphery of the annular conductive foamed plastic 24 is extended outside the coupling interface 30. Hence it is difficult to squeeze the annular conductive foamed plastic 24 into the coupling interface 30. As a result, interference occurs, and assembly cannot be done smoothly.

Moreover, adding the annular spacer and the annular conductive foamed plastic increases the cost of the coupling mechanism. Hence how to reduce the interference of the annular conductive foamed plastic during assembly and reduce the cost of the coupling mechanism are issues pending to be overcome.

SUMMARY OF THE INVENTION

In view of the aforesaid problems, the present invention aims to provide a coupling mechanism adopted for use on a mainboard to reduce interference during assembly and prevent leaking of electromagnetic waves.

The coupling mechanism according to the invention mainly includes a coupling member and two bucking blades. The coupling member has a coupling portion and two anchor ends. The coupling portion has an upper side and a lower side, each having a groove. The two anchor ends are vertically located on two sides of the coupling portion in a parallel manner to enable the plugging main board to be anchored on the coupling mechanism. Further, electromagnetic waves are prevented from leaking from the two sides of the coupling portion. The two bucking blades are wedged respectively in the upper and the lower grooves.

The foregoing, as well as additional objects, features and advantages of the invention will be more readily apparent from the following detailed description, which proceeds with reference to the accompanying drawings.

BRIEF DESCRIPTION OF THE DRAWINGS

FIG. 2 is a schematic view of the invention in an assembly condition;

DESCRIPTION OF THE PREFERRED EMBODIMENTS

Figure 1A:
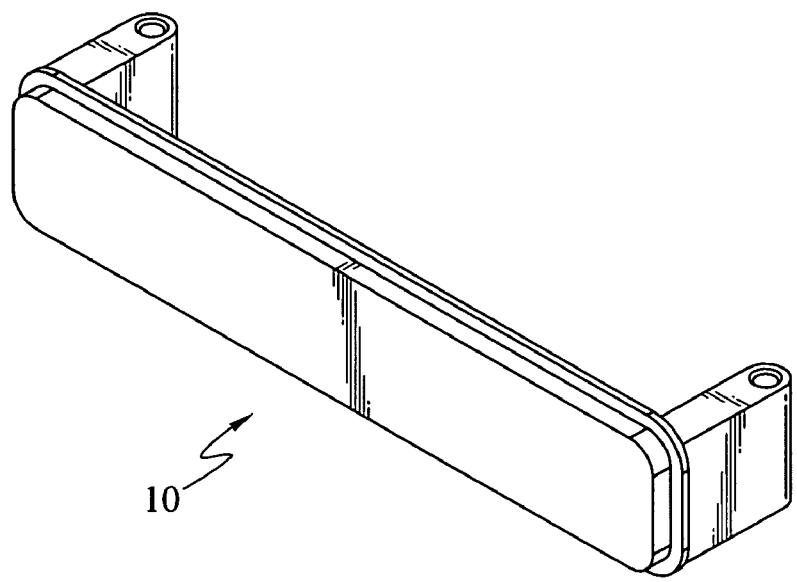
FIG. 1A is a perspective view of a first conventional coupling mechanism.
Figure 1B:
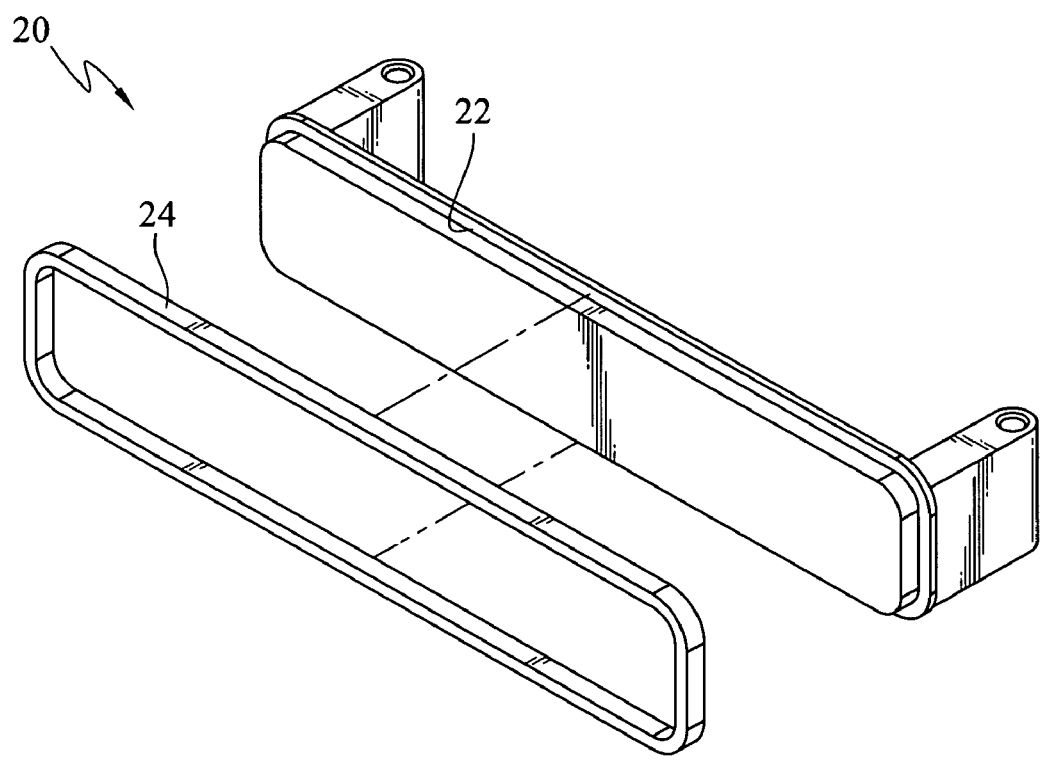
FIG. 1B is an exploded view of a second conventional coupling mechanism.
Figure 1C:
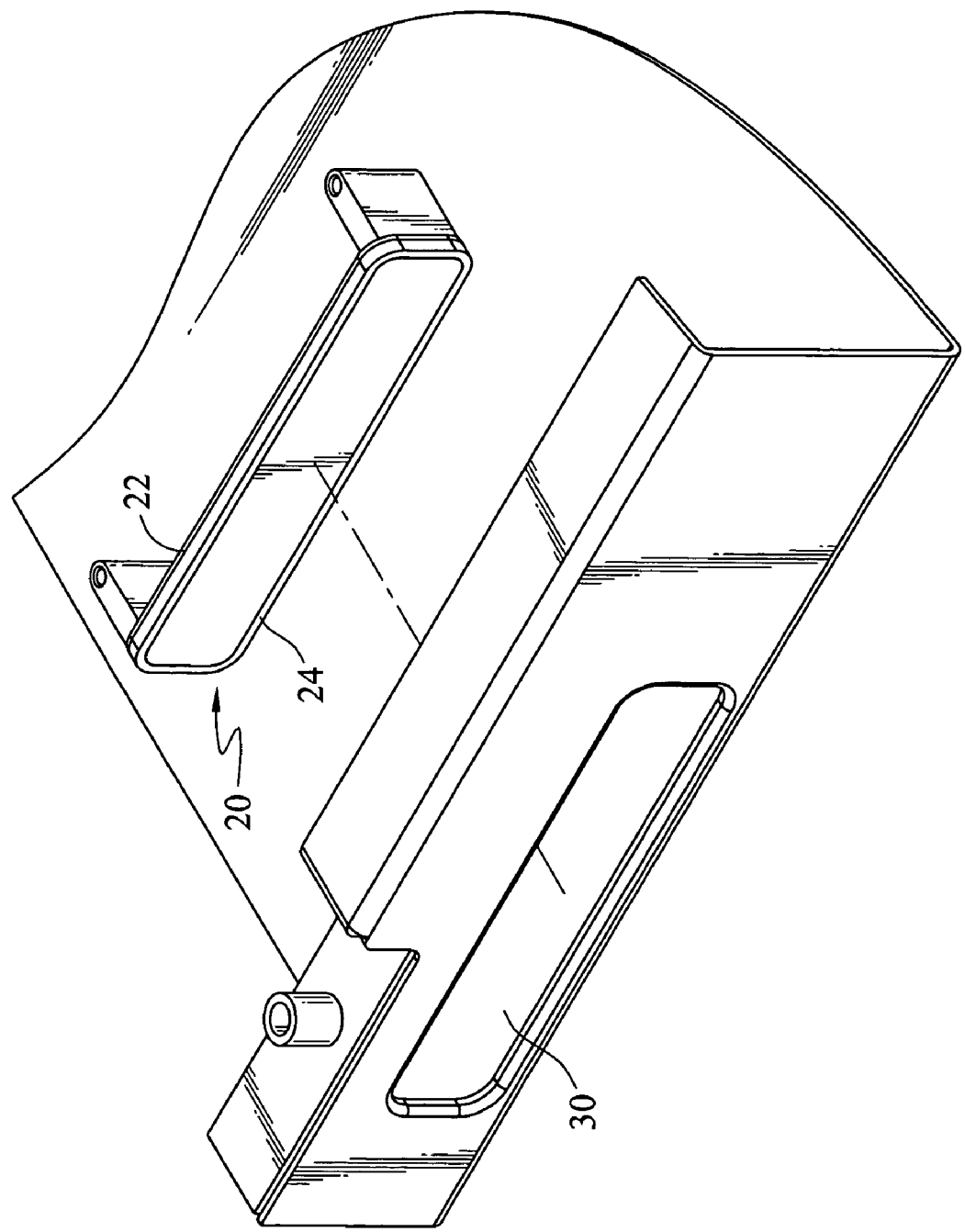
FIG. 1C is a schematic view of the second conventional coupling mechanism in an assembly condition.

Refer to FIG. 2 for the invention in an assembly condition. The coupling mechanism 100 aims to anchor a plugging main board 200 on a coupling interface 300 of an electronic device (not shown in the drawing).

The general plugging main board 200 has at least one anchor hole 202 to couple with a fastening element from the coupling mechanism 100, to anchor the plugging main board 200 firmly on the coupling mechanism 100.

The coupling interface 300 may be located on the host frame of the electronic device. Hence when the coupling mechanism 100 is latched on the coupling interface 300, it is held on the host frame of the electronic device.

The plugging main board 200 generally is used on the blade main board of razor servers, graphic cards, sound cards, and the like. The coupling interface 300 has a size slightly larger than the coupling mechanism 100, for holding the coupling mechanism 100.

Figure 3:
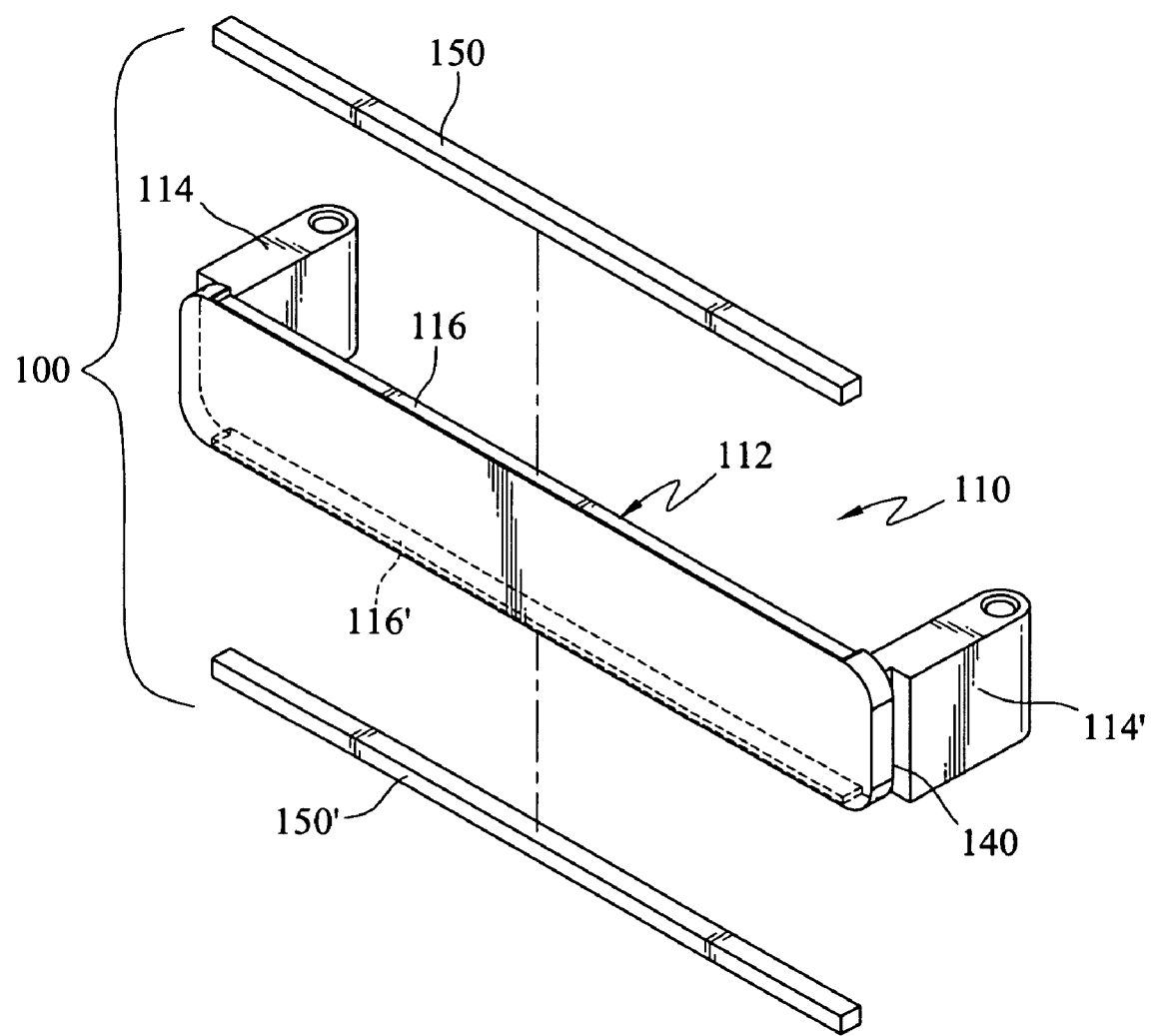
FIG. 3 is an exploded view of an embodiment of the invention.

Referring to FIG. 3, the coupling mechanism 100 mainly includes a coupling member 110 and two bucking blades 150 and 150'. Details of the structure are elaborated as follows:

The coupling member 110 includes a coupling portion 112 and anchor ends, 114 and 114'. The coupling portion 112 has an upper side and a lower side that have respectively a groove 116 and 116'. The anchor ends 114 and 114' are located vertically on two sides of the coupling portion 112 in a parallel manner, to anchor the plugging main board 200 (not shown in the drawing) on the coupling mechanism 100, and prevent electromagnetic waves from leaking through the two sides of the coupling portion 112.

In practice, the anchor ends 114 and 114' are formed in an L-shape, and may be fabricated integrally, or formed by stamping, soldering, riveting or the like on two sides of the coupling member 110.

Figure 4A:
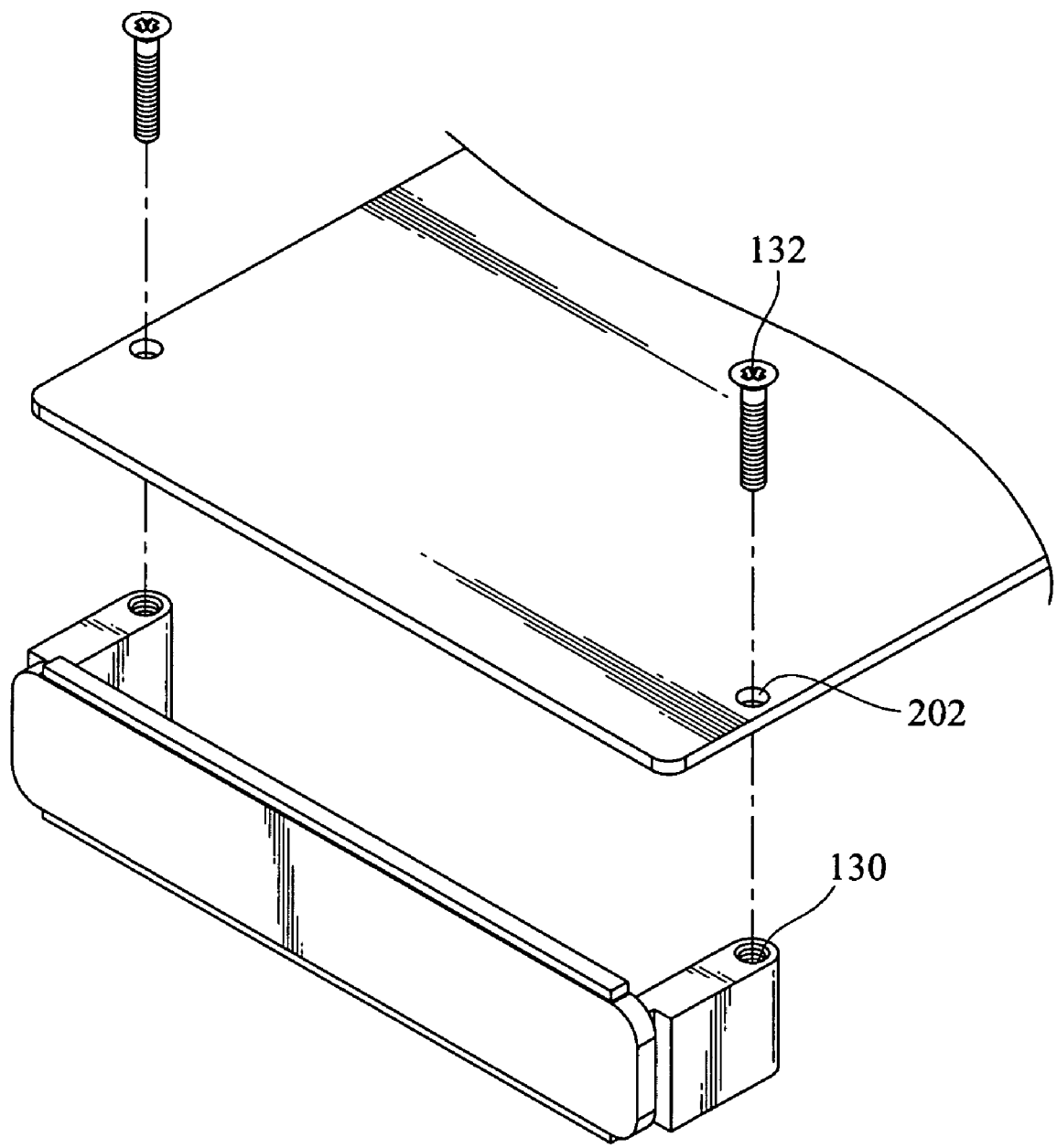
FIG. 4A is a schematic view of an embodiment of the latch section.

Moreover, the anchor ends 114 and 114' may have respectively a latch section or aperture to enable the plugging main board 200 to be anchored on the coupling mechanism 100. Refer to FIG. 4A for an embodiment that uses the latch section, and FIG. 4B for another embodiment that uses the aperture, for anchoring the plugging main board 200 on the coupling mechanism 100.

Figure 4B:
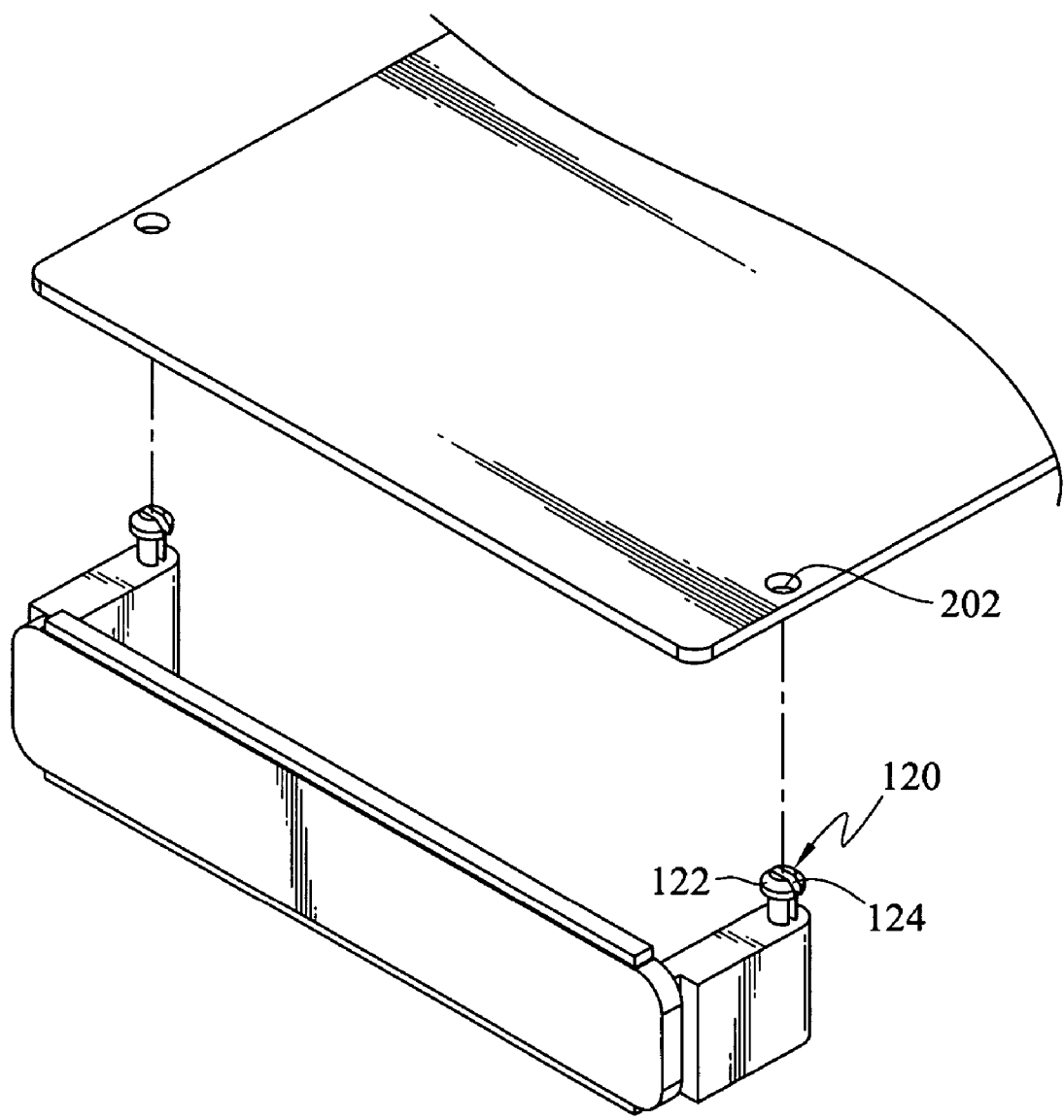
FIG. 4B is a schematic view of an embodiment of the aperture.

Referring to FIG. 4B, a latch section 120 is provided that has a retaining section 122 and a cavity 124. When the plugging mainboard 200 (not shown in the drawing) is subject to a force and the anchor hole 202 passes through the retaining section 122 to the cavity 124, the retaining section 122 confines the anchor hole 202 to prevent the plugging mainboard 200 from escaping and anchor the plugging mainboard 200 on the coupling mechanism.

Referring to FIG. 4A, an aperture 130 is provided on the anchor ends 114 or 114' to couple with the anchor hole 202 of the plugging main board 200 through a fastening element 132, to anchor the plugging main board 200 on the coupling mechanism 100.

In practice, the fastening element 132 may be a screw or a tenon. When the fastening element 132 is a screw, the aperture 130 and the anchor hole 202 of the plugging main board 200 have respectively internal screw threads to engage with the external screw threads of the screw, to enhance the fastening effect.

For assembly, move the coupling mechanism 100 close to the coupling interface 300 of the electronic device until the coupling interface 300 is engaged with the bottom of a latch portion 140 of the anchor end 114 or 114' so that the coupling mechanism 100 is maintained at a latch position. At the latch position the plugging main board 200 is electrically connected to the electronic device.

The two bucking blades 150 and 150' are located respectively in the grooves 116 and 116' of the coupling member 110 and bonded by an adhesive means such as a double-sided adhesive tape or the like.

In practice, the bucking blades 150 and 150' may be conductive foamed plastics that can prevent penetration of electromagnetic waves, or any material that can be squeezed and deformed when the coupling member 110 is compressed by the coupling interface 300, to fill the tolerance there between and block the electromagnetic waves.

In the embodiments of the invention, the latch sections 120, apertures 130 and fastening elements 132 are not limited. However, at least one must be provided to anchor the plugging main board 200 on the coupling mechanism 100.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. A coupling mechanism for anchoring a plugging mainboard on a coupling interface of an electronic device to prevent electromagnetic wave generated by the plugging mainboard when connected electrically to the electronic device from leaking outwards, comprising:
a coupling member which has a coupling portion and two anchor ends, the coupling portion having respectively a groove on a upper side and a lower side, the anchor ends being vertically located on two sides of the coupling portion in parallel with each other to latch and anchor the plugging mainboard on the coupling mechanism and prevent the electromagnetic wave from leaking outwards through the two sides of the coupling portion; and
two bucking blades wedged in the grooves;
wherein the bucking blades are squeezed and deformed by the coupling member and the coupling interface when the coupling member receives a force to maintain a latch position with the coupling interface to fill a tolerance between the coupling member and the coupling interface to prevent the electromagnetic wave from leaking out.

2. The coupling mechanism of claim 1, wherein the anchor ends are located on two sides of the coupling member by integrated forming, stamping, soldering or riveting.

3. The coupling mechanism of claim 1, wherein the anchor ends are made of metal which shields electromagnetic wave.

4. The coupling mechanism of claim 1, wherein the plugging mainboard is electrically connected to the electronic device at the latch position.

5. The coupling mechanism of claim 1, wherein the anchor ends have respectively a latch portion to maintain the coupling member at the latch position.

6. The coupling mechanism of claim 1, wherein one of the anchor ends has a latch section to couple with an anchor hole formed on the plugging mainboard to anchor the plugging mainboard on the coupling mechanism.

7. The coupling mechanism of claim 1, wherein one of the anchor ends has an aperture to fasten the plugging mainboard on the coupling mechanism.

8. The coupling mechanism of claim 7, wherein the aperture is coupled with an anchor hole formed on the plugging mainboard through a fastening element to fasten the plugging mainboard on the coupling mechanism.

9. The coupling mechanism of claim 8, wherein the fastening element is a screw.

10. The coupling mechanism of claim 8, wherein the fastening element is a tenon.

11. The coupling mechanism of claim 1, wherein the bucking blades are conductive foamed plastics that prevent the electromagnetic wave from penetrating.

12. The coupling mechanism of claim 1, wherein the bucking blades are bonded to the grooves through an adhesive means.

13. The coupling mechanism of claim 12, wherein the adhesive means is a double-sided adhesive tape.

* * * * *